United States Patent
Nam et al.

(10) Patent No.: US 8,325,855 B2
(45) Date of Patent: Dec. 4, 2012

(54) ITERATIVE RECEIVER AND ITERATIVE DECODER

(75) Inventors: Junyoung Nam, Daejeon (KR); Seong Rag Kim, Daejeon (KR); Hyun Kyu Chung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 353 days.

(21) Appl. No.: 12/746,744

(22) PCT Filed: Nov. 26, 2008

(86) PCT No.: PCT/KR2008/006957
§ 371 (c)(1),
(2), (4) Date: Jun. 7, 2010

(87) PCT Pub. No.: WO2009/072774
PCT Pub. Date: Jun. 11, 2009

(65) Prior Publication Data
US 2010/0266069 A1    Oct. 21, 2010

(30) Foreign Application Priority Data
Dec. 7, 2007 (KR) .................. 10-2007-0126979

(51) Int. Cl.
*H04L 27/06* (2006.01)
*H03M 13/03* (2006.01)
(52) U.S. Cl. ...................... 375/340; 714/788
(58) Field of Classification Search .......... 375/260, 375/324, 340, 341, 349, 350, 265; 714/761, 714/762, 787, 788
See application file for complete search history.

(56) References Cited

U.S. PATENT DOCUMENTS

| | | | | |
|---|---|---|---|---|
| 7,434,145 B2* | 10/2008 | Jin et al. | | 714/780 |
| 8,059,729 B2* | 11/2011 | Zhidkov | | 375/260 |
| 2003/0014714 A1* | 1/2003 | Yamada | | 714/786 |
| 2004/0062302 A1* | 4/2004 | Fujii et al. | | 375/232 |
| 2005/0235195 A1* | 10/2005 | Choi et al. | | 714/800 |
| 2007/0136648 A1* | 6/2007 | Kwon et al. | | 714/794 |

FOREIGN PATENT DOCUMENTS

| KR | 1020000076753 | 12/2000 |
|---|---|---|
| KR | 1020060118313 | 11/2006 |

OTHER PUBLICATIONS

Douillard, Catherine et al., "Iterative Correction of Intersymbol Interference: Turbo-Equalization," European Transactions on Telecommunications, vol. 6(5):507-511 (1995).

Haykin, Simon et al., "Turbo-MIMO for Wireless Communications," IEEE Communications Magazine, vol. 42(10):48-53 (2004).

Witzke, Melanie et al., "Iterative Detection of MIMO Signals with Linear Detectors," Signals, Systems and Computers, vol. 1:289-293 (2002).

\* cited by examiner

*Primary Examiner* — Kevin Kim
(74) *Attorney, Agent, or Firm* — Nelson Mullins Riley & Scarborough LLP; EuiHoon Lee, Esq.

(57) ABSTRACT

An iterative receiver and an iterative decoder are provided. The iterative receiver includes: an external decoder to decode the detected received signal; an impurity adder to add an impurity to an output signal of the external decoder; an interleaver to perform interleaving between the internal detector and the external decoder; and a de-interleaver to perform de-interleaving between the internal detector and the external decoder.

10 Claims, 6 Drawing Sheets

[Fig. 1]
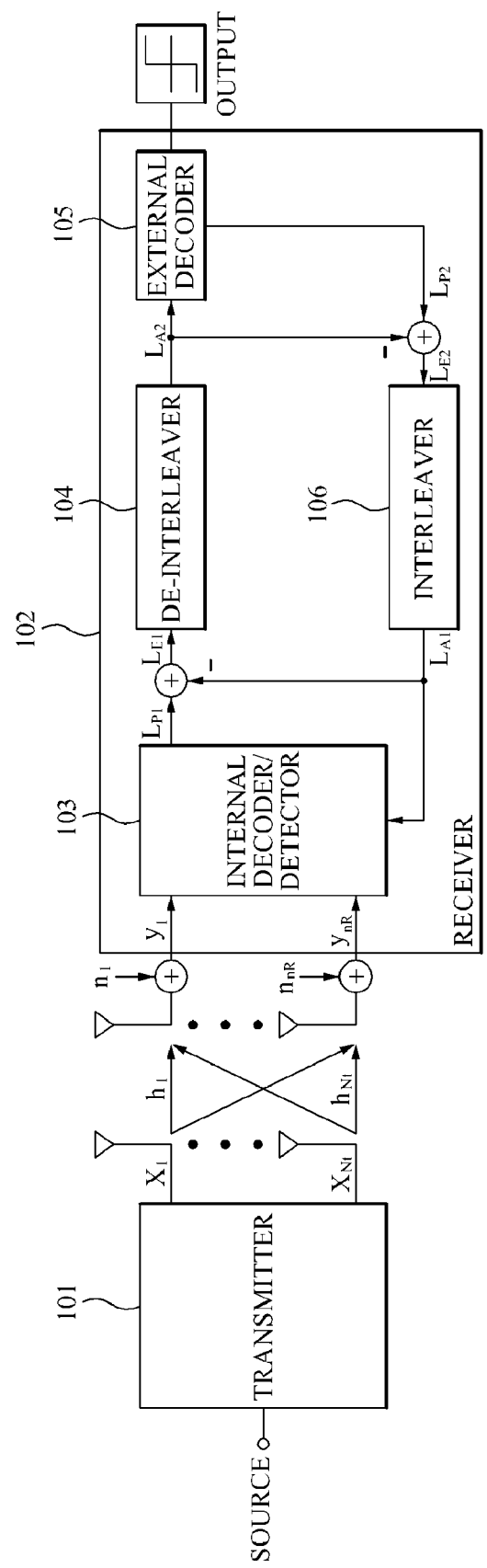

[Fig. 2]
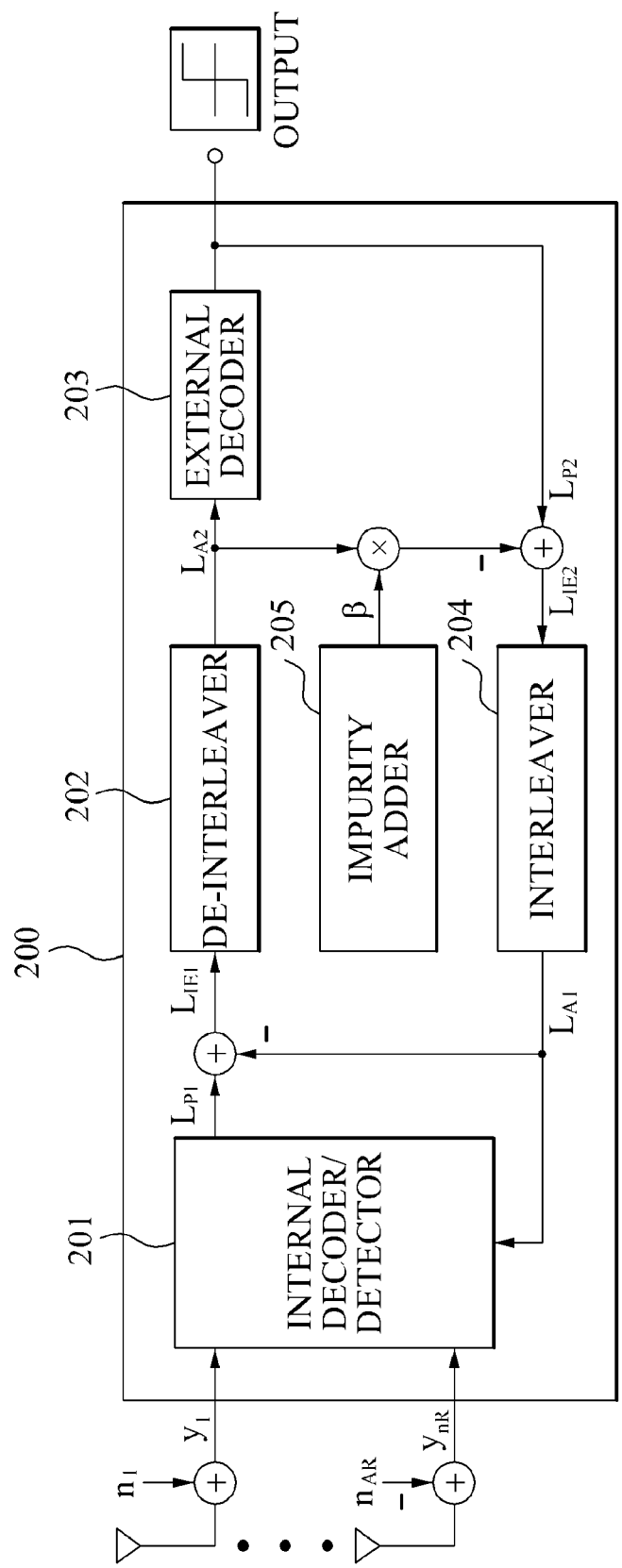

[Fig. 3]
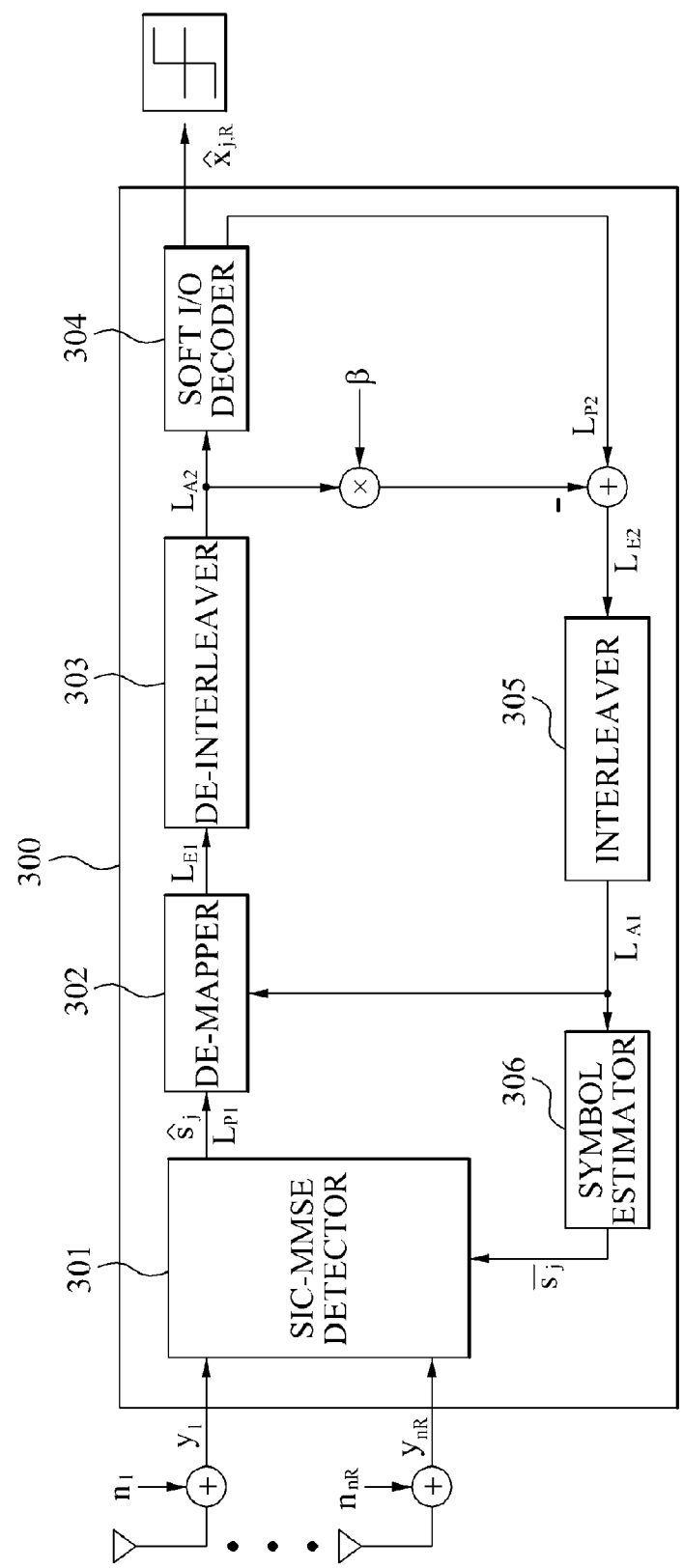

[Fig. 4]
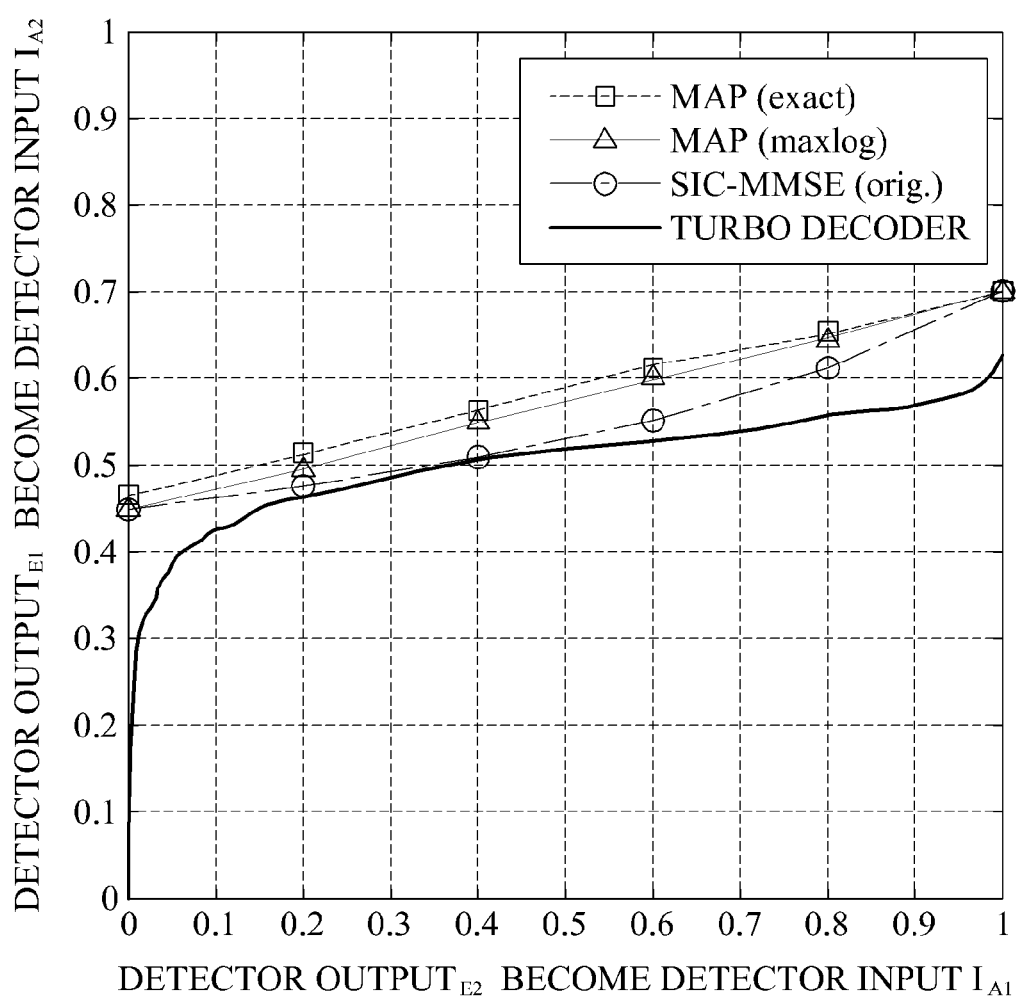

[Fig. 5]
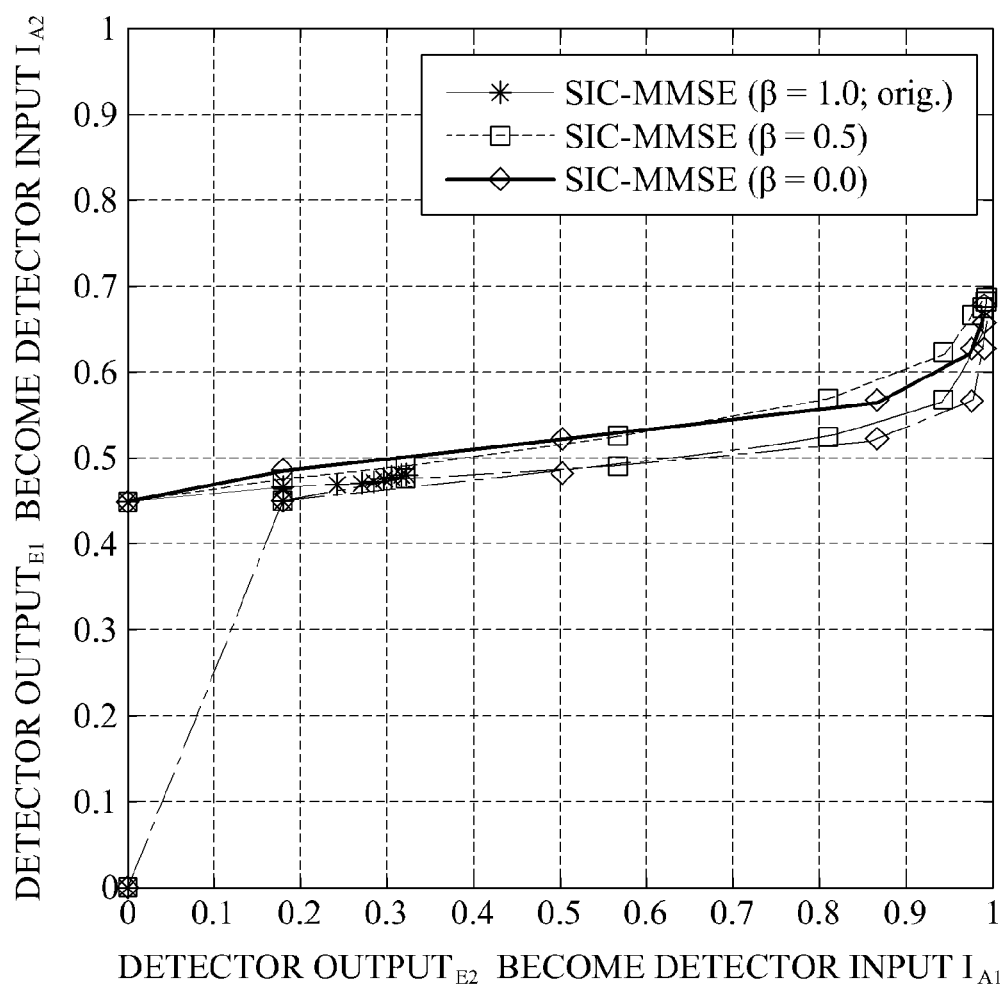

[Fig. 6]
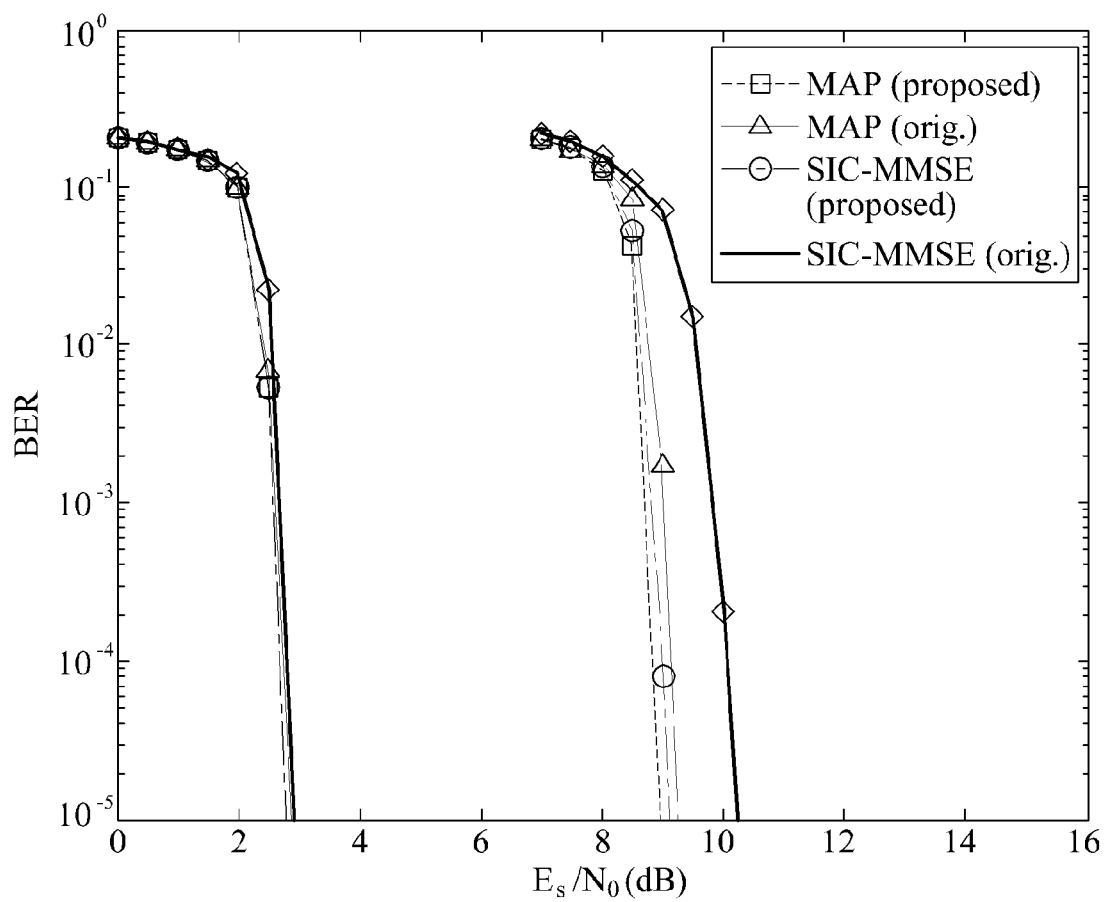

ITERATIVE RECEIVER AND ITERATIVE DECODER

RELATED APPLICATIONS

This application is a 35 U.S.C. §371 national stage filing of PCT Application No. PCT/KR2008/006957 filed on Nov. 26, 2008, which claims priority to, and the benefit of, Korean Patent Application No. 10-2007-0126979 filed on Dec 7, 2007. The contents of the aforementioned applications are hereby incorporated by reference.

TECHNICAL FIELD

The present invention relates to an iterative receiver and an iterative decoder in a communication system, and more particularly, to a data receiving apparatus of a communication system that can use an orthogonal frequency division multiplexing (OFDM) scheme.

This work was supported by the IT R&D program of MIC/IITA. [2006-S-001-02, Development of Adaptive Radio Access and Transmission Technologies for 4th Generation Mobile Communications]

BACKGROUND ART

Due to characteristic of a radio channel, when a digital mobile communication system transmits data, a bit error may occur by various types of causes. Therefore, a channel code that is used to correct the bit error is significantly important.

A turbo code and a low-density parity-check (LDPC) code are generally used as a channel code that approaches a Shannon capacity in an aspect of the configurable decoding complexity. The turbo code and the LDPC code are based on a turbo principle.

The turbo principle denotes iterative exchanging of soft-decision information between a plurality of modules. The turbo principle may iteratively update a log-likelihood ratio (LLR) value of a bit based on an extrinsic LLR value of a decoder. In a process of decoding a channel according to the turbo principle, as a number of iterative decodings increases, a convergence rate may also increase. Therefore, performance may be improved. However, when the number of iterative decodings increases, a calculation amount may also increase. In this case, there may be some problems in improving the performance.

Accordingly, there is a need for an apparatus that can improve iterative receiving performance, iterative decoding performance, and a convergence rate with using an existing turbo principle.

DISCLOSURE OF INVENTION

Technical Problem

An aspect of the present invention provides an iterative receiver and an iterative decoder that can improve iterative receiving performance, iterative decoding performance, a convergence rate by using a turbo code or a low-density parity-check (LDPC) code as an external decoder and applying a modified turbo principle that appropriately adds an impurity to an output signal based on a turbo principle.

Another aspect of the present invention also provides an iterative receiver and an iterative decoder that can significantly improve iterative receiving performance, iterative decoding performance, and a convergence rate by using, as an internal detector, an optimal detector such as a soft interference cancellation with minimum mean square error (SIC-MMSE) detector or a maximum a posteriori (MAP) detector.

Technical Solution

According to an aspect of the present invention, there is provided a iterative receiver including: an internal detector to detect a received signal; an external decoder to decode the detected received signal; an impurity adder to add an impurity to an output signal of the external decoder; an interleaver to perform interleaving between the internal detector and the external decoder; and a de-interleaver to perform de-interleaving between the internal detector and the external decoder.

The internal detector may be a soft interference cancellation with minimum mean square error (SIC-MMSE) detector. Also, the internal detector may be a maximum a posteriori (MAP) detector or a suboptimal MAP detector with low complexity.

The impurity adder may add the impurity to extrinsic information of the external decoder, the impurity in which a weight is applied to a priori information of the external decoder.

According to another aspect of the present invention, there is provided an iterative decoder including: an internal decoder to decode a received signal; an external decoder to decode the decoded received signal; an impurity adder to add an impurity to an output signal of the external decoder; an interleaver to perform interleaving between the internal decoder and the external decoder; and a de-interleaver to perform interleaving between the internal decoder and the external decoder.

The impurity adder may adjust the weight to control an amount of impurity to be added to the extrinsic information of the external decoder.

BRIEF DESCRIPTION OF THE DRAWINGS

FIG. 1 illustrates a configuration of an iterative receiver and an iterative decoder according to a conventional art;

FIG. 2 illustrates a configuration of another iterative receiver and another iterative decoder according to an embodiment of the present invention;

FIG. 3 illustrates an example of an iterative receiver including a soft interference cancellation with a minimum mean square error (SIC-MMSE) detector according to an embodiment of the present invention;

FIG. 4 is an extrinsic information transfer (EXIT) graph of a maximum a posteriori (MAP) detector, an SIC-MMSE detector, and a turbo decoder according to the conventional art;

FIG. 5 is an EXIT graph of an iterative receiver including an SIC-MMSE detector based on a turbo principle according to an embodiment of the present invention; and FIG. 6 is a graph illustrating a bit error ratio regarding performance optimization effect by a weight according to an embodiment of the present invention.

MODE FOR THE INVENTION

Reference will now be made in detail to embodiments of the present invention, examples of which are illustrated in the accompanying drawings, wherein like reference numerals refer to the like elements throughout. The embodiments are described below in order to explain the present invention by referring to the figures.

FIG. 1 illustrates a configuration of an iterative receiver and an iterative decoder according to a conventional art.

FIGS. 1 through 3 will be described based on an iterative receiver. The present invention may be similarly applicable to an iterative decoder. FIGS. 1 through 3 will be described based on a Multiple-Input Multiple-Output (MIMO) system, but the present invention is not limited thereto. The present invention may be applicable to various types of communication systems. Hereinafter, the present invention will be described generally based on the MIMO system.

A MIMO technology in a radio communication denotes a technology that can transmit signals to a transmitting/receiving end via two or more antennas. As shown in FIG. 1, a plurality of transmitting/receiving antennas is used. Therefore, a plurality of spatial channels may be obtained. It is possible to improve a data rate and reliability of data transmission using the obtained plurality of spatial channels.

In the MIMO system, a received signal of an Nt dimension may be represented as, $$y = Hx + n. \qquad \text{[Equation 1]}$$

$$H = [h_1, h_2, \ldots, h_{N_t}]$$

is an
$N_r \times N_t$
channel matrix.
$x = [x_1, x_2, \ldots, x_{N_t}]^T$ s is a transmission signal vector. n is an additive white Gaussian noise (AWGN) and may be represented as
$n = [n_1, n_2, \ldots, n_{n_R}]$.

Specifically, x denotes a vector of a transmission signal that is transmitted by a transmitter 101. Each subscript corresponds to two or at least two antennas installed in the transmitter 101. Also, the energy of the transmission signal vector is $$E[xx^H] = \gamma I.$$

A signal-to-noise ratio (SNR) for each receiving antenna with respect to $$E[nn^H] = I$$

is
$\gamma$.

In the MIMO system, a receiver 102 may include an internal decoder or an internal detector 103, a de-interleaver 104, an external decoder 105, and an interleaver 106. When the internal decoder 103 is provided, the receiver 102 may function as an iterative decoder. When the internal detector 103 is provided, the receiver 102 may function as an iterative receiver. Hereinafter, a configuration of the receiver 102 when the internal detector 103 is provided to detect a received signal will be described with reference to FIGS. 1 through 3. Descriptions will be similarly applicable to when the internal decoder 103 is provided.

The internal detector 103 may detect the received signal that is transmitted by the transmitter 101 via at least two antennas in the MIMO system. The external decoder 105 may decode the detected received signal.

The de-interleaver 104 may perform de-interleaving between the internal detector 103 and the external decoder 105. Referring to FIG. 1, the de-interleaver 104 de-interleaves an output signal of the internal detector 103. The interleaved signal becomes an input signal of the external decoder 105.

The interleaver 106 may perform interleaving between the internal detector 103 and the external decoder 105. Specifically, referring to FIG. 1, the interleaver 106 interleaves an output signal of the external decoder. The interleaved signal becomes an input signal of the internal detector 106. Therefore, the received signal may be iteratively de-interleaved and interleaved in the entire configuration of FIG. 1.

FIG. 1 illustrates a conventional iterative receiving and iterative decoding scheme based on a turbo principle. According to the present invention, $L_{A1}$, $L_{E1}$, and $L_{P1}$ denote a priori log-likelihood ratio (LLR), an extrinsic LLR, and a posteriori LLR respectively. Subscripts 1 and 2 denote an internal detector/decoder and an external decoder 105 respectively. LLR may be defined by, $$L(x_k \mid y) = \ln \frac{Pr(x_k = +1 \mid y)}{Pr(x_k = -1 \mid y)} \qquad \text{[Equation 2]}$$

As shown in FIG. 1, a posteriori information of the internal detector 103 includes an addition of a priori information of the internal detector 103 that has passed through the interleaver 106 and extrinsic information of the internal detector 103. Specifically, $L_{P1} = L_{A1} + L_{E1}$, which will be applied to the external decoder 105.

Hereinafter, when the internal detector 103 is a maximum a posteriori (MAP) detector will be described. The MAP detector is an optimal detector, whereas a calculation amount is extremely great. Therefore, when a relatively large number of antennas and a number of bits for each symbol exist, it may be impossible to configure the MAP detector. However, the MAP detector has excellent iterative receiving performance, and thus can be a model for other detectors.

Referring to FIG. 1, when the internal detector 103 is the MAP detector, the MAP detector may calculate the posteriori LLR, using the priori LLR given by the external decoder 105, according to, $$L_P(x_{j,k} \mid y) = L_A(x_{j,k}) + \ln \frac{\sum_{x \in X_{j,k}^{+1}} p(y \mid x) \exp\left(\frac{1}{2} x_{[j,k]}^T L_A\right)}{\sum_{x \in X_{j,k}^{-1}} p(y \mid x) \exp\left(\frac{1}{2} x_{[j,k]}^T L_A\right)} \qquad \text{[Equation 3]}$$

$X_{j,k}$
denotes a $k^{th}$ bit of a transmission symbol of a $j^{th}$ transmitting antenna. Mc denotes the number of bits for each symbol.
$X_{j,k}^b$
is a set of x where $$x_{j,k} = b, b \in \{+1, -1\}$$

and may have
$2^{N_t M_c - 1}$
cases.
$X_{[j,k]}$
denotes a vector that includes an element to satisfy
$X_{j,k} = 0$.

$$L_A = [L_A(x_{1,1}), \ldots, L_A(x_{N_t M_c})]^T$$

denotes a vector that includes priori LLRs.

FIG. 2 illustrates a configuration of an iterative receiver 200 and an iterative decoder according to an embodiment of the present invention.

In the iterative receiver 200, an internal detector 201 may be a soft interference cancellation with minimum mean square error (SIC-MMSE) detector. The internal detector 201 may be a MAP detector or a suboptimal MAP detector with low complexity.

An important characteristic of a conventional turbo principle is an iterative scheme of transmitting and receiving extrinsic information between two internal detectors, or between an internal detector and an external detector to thereby converge the extrinsic information to a global optima. It is possible to maintain statistical independence between an internal element and an external element by applying the iterative scheme. In comparison to FIG. 1, a modified turbo principle according to the present invention may further include an impurity adder 205.

Extrinsic information corresponds to information excluding a priori information from a posteriori information. According to the present invention, the impurity adder 205 may add a portion of a priori information to the extrinsic information instead of excluding all the a priori information from the a posteriori information.

Specifically, the impurity adder 205 may add an impurity to extrinsic information of an external decoder 203. In the impurity, a weight is applied to a priori information of the external decoder 203. The impurity adder 205 may adjust the weight to control an amount of impurity to be added to the extrinsic information of the external decoder 203.

The effect that can be obtained by adding the impurity to the extrinsic information of the external decoder 203 will be described later with reference to FIGS. 5 and 6. The internal decoder/internal detector 201, a de-interleaver 202, the external decoder 203, and an interleaver 204 of FIG. 2 correspond to the internal decoder/internal detector 103, the de-interleaver 104, the external decoder 105, and the interleaver 106 of FIG. 1, respectively.

For example, the external decoder 203 may decode a received signal detected by the internal detector 201, or a received signal decoded by the internal detector 201, using a turbo code based on a turbo principle, or using an LDPC code based on the turbo principle. The impurity adder 205 may apply a weight to a priori information of the external decoder 203 to adjust an amount of impurity.

The interleaver 204 may interleave a result that is obtained by adding to extrinsic information of the external decoder 206 with the impurity in which the weight is applied to a priori information corresponding to an input signal of the external decoder 203.

A prior LLR of the internal detector 201 may be calculated as given by, $$L_{A_1} = \Pi(L_{P_2} - L_{A_2} \times \beta) \quad \text{[Equation 4]}$$
$$= \Pi(L_{E_2} + (1-\beta)L_{A_2})$$
$$= \Pi(L_{IE_2}) = L_{A_{1,O}} + L_{A_{1,I}}$$

$L_{A_1}$
denotes the priori LLR of the internal detector 201.
$L_{P_2}$
denotes a posteriori information by the external decoder 203.
$L_{E_2}$
denotes an extrinsic LLR of the external decoder 203 when the impurity is not added.

$L_{IE_2}$
denotes the extrinsic LLR in which the impurity is added by the impurity adder 205.
$L_{A_{1,O}}$
denotes a pure priori LLR by the external decoder 203.
$L_{A_{1,I}}$
is a priori LLR in which the impurity is added and also denotes the impurity in FIG. 2.
π
denotes interleaving by the interleaver 204
β.
denotes the weight to adjust the amount of impurity. When β=1,
it may denote a conventional iterative receiver. It is possible to design a system to appropriately set the weight β.

Specifically, in comparison to FIG. 1, a priori LLR of the internal detector 201 may be further increased by the impurity adder 205.

In Equation 4, a prior information
$L_{A_1}$
of the internal detector 201 denotes a result that is obtained by interleaving extrinsic information.
$L_{IE_2}$.
The extrinsic information
$L_{IE_2}$
is obtained by subtracting a posteriori information
$L_{P_2}$
by the external decoder 203 from the multiplication result between a priori information
$L_{A_2}$
of the external decoder 203 and the impurity).
β.
Specifically, the impurity adder 205 denotes adding the impurity in which a predetermined weight, for example, 1−β,
is applied to a priori information of the external decoder 203, to the pure extrinsic information
$L_{E_2}$
of the external decoder 203.

FIG. 3 illustrates an example of an iterative receiver 300 including an SIC-MMSE detector 301 according to an embodiment of the present invention.

The iterative receiver 300 may further include a de-mapper 302 and a soft input/output (I/O) decoder 304 in addition to the iterative receiver 200 of FIG. 2. Also, the iterative receiver 300 may replace the internal decoder/detector 201 of the iterative receiver 200 with an SIC-MMSE detector 301. The soft I/O decoder 304 may correspond to the external decoder 203 of the iterative receiver 200.

The SIC-MMSE detector 301 corresponding to a non-optimal internal detector may relieve a remaining interference of a soft-interference canceled signal via an MMSE filter, which may be expressed by the following Equation 6. A $j^{th}$ antenna symbol after soft interference cancellation may be given by:

$$y_j = y - H\overline{s}_j. \quad \text{[Equation 6]}$$

$\overline{s}_j$
denotes a symbol vector estimated by a symbol estimator 306. The SC-MMSE detector 301 may filter a signal
$y_j$
in which interference is removed to thereby generate a signal
$\hat{s}_j$.

The de-mapper 302 may de-map the generated signal $\hat{S}_j$ to thereby generate an existing signal. The conditional probability of the signal $\hat{S}_j$ according to Gaussian approximation may be expressed as, $$p(\hat{s}_j \mid s_j) = \frac{1}{v_j^2 \pi} \exp\left(-\frac{|\hat{s}_j - \mu_j s_j|^2}{v_j^2}\right). \quad \text{[Equation 7]}$$

$\mu_j$ denotes the average of $\hat{S}_j$ that is generally obtained according to the Gaussian approximation and $v_j^2$ is a variance of $\hat{S}_j$.

Therefore, an extrinsic LLR calculated by the SIC-MMSE detector 301 may be expressed as, $$L_E(x_{j,k} \mid y) = \ln \frac{\sum_{s_j \in S_j^{+1}} p(\hat{s}_j \mid s_j) \prod_{i=1,\ldots,M_C, j \neq k} P_A(x_{j,i})}{\sum_{s_j \in S_j^{-1}} p(\hat{s}_j \mid s_j) \prod_{i=1,\ldots,M_C, j \neq k} P_A(x_{j,i})}. \quad \text{[Equation 8]}$$

$S_j^{+b}$ is a set of x where $x_{j,k}=b, b \in \{+1,-1\}$ and has a $2^{N_c-1}$ number of cases.

FIG. 4 is an extrinsic information transfer (EXIT) graph of a MAP detector, an SIC-MMSE detector, and a turbo decoder according to the conventional art.

The EXIT graph is an analytical instrument to form extrinsic information transmitted and received between an internal detector and an external detector into an iterative performance orbit. A curve MAP (maxlog) indicates an approximate value of an exact MAP detector according to a maxlog approximation scheme.

Referring to FIG. 4, an interval between the curve of the MAP detector and a curve of the turbo decoder is sufficiently greater and thus it is possible to decode a received signal without an error as a result of the iterative performance. Conversely, a curve of the SIC-MMSE detector nearly contacts with the curve of the turbo decoder. Specifically, even though the iterative performance is performed a large number of times, receiving performance may not be improved and the received signal may include an error.

FIG. 5 is an EXIT graph of an iterative receiver including an SIC-MMSE detector based on a turbo principle according to an embodiment of the present invention.

FIG. 5 illustrates an EXIT graph of an SC-MMSE detector based on a modified turbo principle according to an embodiment of the present invention. As shown in FIG. 5, when $\beta=0.5$ and when $\beta=0.0$, a contacting area between the SC-MMSE detector and the turbo decoder increases.

Accordingly, as a result of iterative performance, SC-MMSE detector is possible to receive a signal in which an error is excluded, like the MAP detector. This result may be obtained since mutual information of the contacting area increases due to the impurity added to the extrinsic information.

Specifically, when an extrinsic LLR of a decoder is greater than or equal to a predetermined level to be reliable and in this instance, a priori LLR is partially added to a pure extrinsic LLR, it is possible to improve the reliability of the extrinsic LLR that is output by the detector. The extrinsic LLR of the detector with the improved reliability may improve the reliability of the extrinsic LLR of the decoder.

In comparison to the conventional turbo principle, in the case of the modified turbo principle according to the present invention, side effect of interfering statistical independence between the detector and the decoder may be caused due to the impurity. Specifically, as shown in FIG. 5, as the iterative performance is proceeded, the interval between the detector and the decoder is narrowed in comparison to FIG. 4.

However, the above side effect may be neglected in comparison to a pure effect by the impurity and may also be solved by an appropriate selection of a weight. For example, the SIC-MMSE detector may show excellent tradeoff between the pure effect and the side effect as given by, $$\beta_i = \phi^{i-1} \quad \text{[Equation 9]}$$

i indicates an iterative sequence.

FIG. 6 is a graph illustrating a bit error ratio (BER) regarding performance optimization effect by a weight according to an embodiment of the present invention.

For example, FIG. 6 shows the performance optimization effect by the weight of FIG. 9, using the BER. For example, an experimental environment of FIG. 6 used a 4×MIMO, quadrature phase shift keying (QPSK), 16 quadrature amplitude modulation (QAM), 10 iterations, a turbo code, and 8192 message bits.

Referring to FIG. 6, an SIC-MMSE (proposed) corresponding to a detector according to the present invention indicates an iterative receiver using the SIC-MMSE detector by the weight of Equation 4. As shown in FIG. 6, when using the SIC-MMSE (proposed) detector based on the modified turbo principle, the performance was improved by greater than 1 dB in 16 QAM in comparison to the iterative receiver based on the conventional turbo principle.

Also, when using a MAP (proposed) detector based on the modified turbo principle according to the present invention, the performance was improved by about 0.2 dB in comparison to the iterative receiver based on the conventional turbo principle. For example, the EXIT graph of FIG. 6 adopted the weigh as given by, $$\beta_i = \begin{cases} 0.0 & \text{if } i < 5 \\ 0.2 & \text{if } i \geq 5 \end{cases}. \quad \text{[Equation 10]}$$

As induced from FIG. 5, according to the present invention, as a number of antennas and a number of bits for each symbol increases, a MAP detector and a slope of an EXIT chart may increase. Accordingly, the width of the performance improvement may be further increased.

According to the present invention, there are provided an iterative receiver and an iterative decoder that can partially add a priori LLR to a pure extrinsic LLR and thereby increase reliability of an extrinsic LLR that is output by a detector.

Also, according to the present invention, there are provided an iterative receiver and an iterative decoder that can significantly improve iterative receiving performance, iterative decoding performance, and a convergence rate by using, as an internal detector, an optimal detector such as an SIC-MMSE detector or a MAP detector.

Also, according to the present invention, there are provided an iterative receiver and an iterative decoder that can improve iterative receiving performance, iterative decoding performance, a convergence rate by using a turbo code or an LDPC code as an external decoder and applying a modified turbo principle that appropriately adds an impurity to an output signal based on a turbo principle.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents.

The invention claimed is:

1. An iterative receiver comprising:
an internal detector to detect a received signal;
an external decoder to decode the detected received signal;
an impurity adder to add an impurity to an output signal of the external decoder;
an interleaver to perform interleaving between the internal detector and the external decoder; and
a de-interleaver to perform de-interleaving between the internal detector and the external decoder.

2. The iterative receiver of claim 1, wherein the internal detector is a soft interference cancellation with minimum mean square error (SIC-MMSE) detector.

3. The iterative receiver of claim 1, wherein the internal detector is a maximum a posteriori (MAP) detector or a suboptimal MAP detector with low complexity.

4. The iterative receiver of claim 1, wherein the external decoder decodes the detected received signal using a turbo code.

5. The iterative receiver of claim 1, wherein the external decoder decodes the detected received signal using a low-density parity-check (LDPC) code.

6. The iterative receiver of claim 1, wherein the impurity adder adds the impurity to extrinsic information of the external decoder, the impurity in which a weight is applied to a priori information of the external decoder.

7. The iterative receiver of claim 6, wherein the impurity adder adjusts the weight to control an amount of impurity to be added to the extrinsic information of the external decoder.

8. An iterative decoder comprising:
an internal decoder to decode a received signal;
an external decoder to decode the decoded received signal;
an impurity adder to add an impurity to an output signal of the external decoder;
an interleaver to perform interleaving between the internal decoder and the external decoder; and
a de-interleaver to perform interleaving between the internal decoder and the external decoder.

9. The iterative decoder of claim 8, wherein the impurity adder adds the impurity to extrinsic information of the external decoder, the impurity in which a weight is applied to a priori information of the external decoder.

10. The iterative decoder of claim 8, wherein the impurity adder adjusts the weight to control an amount of impurity to be added to the extrinsic information of the external decoder.

* * * * *